US006571372B2

(12) United States Patent
Harada

(10) Patent No.: US 6,571,372 B2
(45) Date of Patent: May 27, 2003

(54) METHOD AND APPARATUS FOR MEASURING AND DESIGNING ELECTRIC CIRCUIT BASED ON TWO-PORT NETWORK THEREOF, AND COMPUTER-READABLE RECORDING MEDIUM FOR RECORDING THE SAME

(75) Inventor: Koji Harada, Kobe (JP)

(73) Assignee: Agilent Technologies, Inc., Palo Alto, CA (US)

(*) Notice: Subject to any disclaimer, the term of this patent is extended or adjusted under 35 U.S.C. 154(b) by 90 days.

(21) Appl. No.: 09/768,575

(22) Filed: Jan. 24, 2001

(65) Prior Publication Data

US 2002/0133790 A1 Sep. 19, 2002

Related U.S. Application Data

(60) Provisional application No. 60/178,437, filed on Jan. 27, 2000.

(51) Int. Cl.$^7$ ............................................. G06F 17/50
(52) U.S. Cl. ................................................ 716/4; 716/1
(58) Field of Search ........................................ 716/1–14

(56) References Cited

U.S. PATENT DOCUMENTS

| | | | |
|---|---|---|---|
| 5,671,150 A | 9/1997 | Maxwell | 364/488 |
| 5,946,482 A | 8/1999 | Barford et al. | 395/500.35 |
| 5,949,900 A | 9/1999 | Mangelsdorf | 395/500.35 |
| 5,990,738 A | 11/1999 | Wright et al. | 330/149 |
| 6,052,029 A | 4/2000 | Uda et al. | 330/227 |
| 6,066,997 A | 5/2000 | Matsugatani et al. | 333/218 |

OTHER PUBLICATIONS

Randall W. Rhea, "Oscillator Design and Computer Simulation", 2$^{nd}$ Edition, 1995, Nobel Publishing Corporation, pp. 1–49, pp. 80–81, pp. 147–157.*
Koji Harada, "Featured Technology: Time and Frequency An S–Parameter transmission model approach to VCO Analysis", pp. 7, 32, 34, 38, 40 and 42, RF Design, Mar. 1999.
RF Design Author Guidelines, "Editorial Guidelines", pp. 1–2, http://www.rfdesign.com/readers/guidelines/index.html, visited Jan. 25, 2000.
Alechno, Stanislaw. "Analysis Method Characterizes Microwave Oscillators," Oscillator Analysis Parts 1–4, Nov. 1997.

* cited by examiner

Primary Examiner—Matthew Smith
Assistant Examiner—Sun James Lin

(57) ABSTRACT

A method and apparatus is provided for measuring circuit parameters by analyzing an electric circuit. An equivalent circuit thereof is entered which comprises elements having element values thereof, and a break point and a virtual ground are specified in the equivalent circuit where the break point is provided for disconnecting an electric path for forming a closed-loop circuit. Then, a 2-port network is generated by disconnecting the electric path at the break point in the entered equivalent circuit to form first and second terminals that are ends of the electric path, where the 2-port network has a first port comprised of the first terminal and the virtual ground, and has a second port comprised of the second terminal and the virtual ground. Furthermore, S-parameters of the generated 2-port network is calculated, and an open-loop transfer function of the electric circuit is calculated according to the calculated S-parameters.

19 Claims, 15 Drawing Sheets

REFLECTION ANALYSIS MODEL CIRCUIT

NEGATIVE RESISTANCE OSCILLATOR

FIRST PREFERRED EMBODIMENT
BASIC MODEL

NON-GROUNDED MODEL

FEEDBACK LOOP MODEL

TRANSMISSION ANALYSIS MODEL (2-PORT NETWORK)

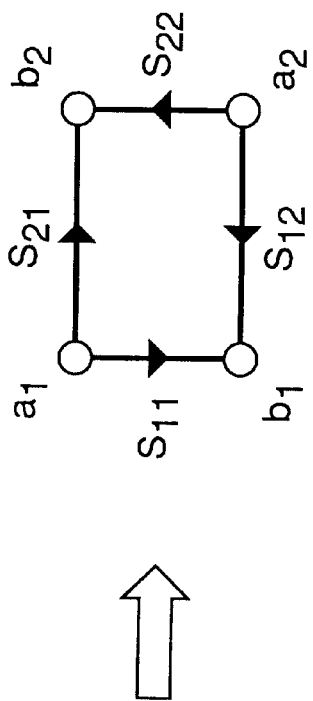
*Fig. 4B* S-PARAMETERS FLOW GRAPH
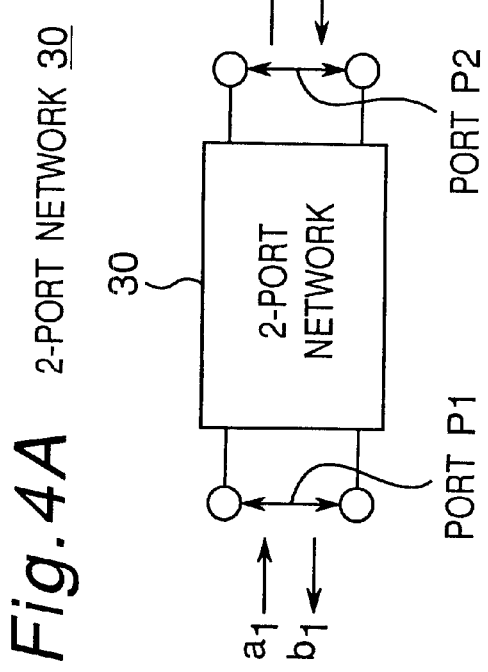
*Fig. 4A* 2-PORT NETWORK 30

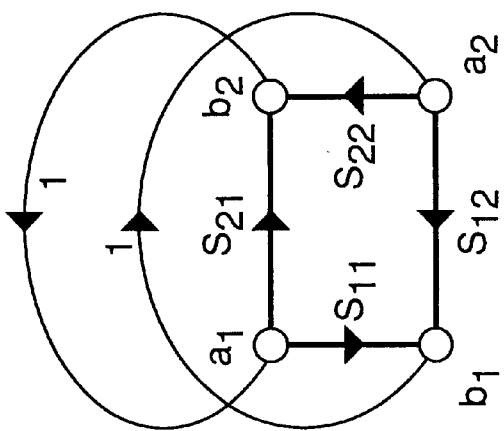
Fig.5B S-PARAMETERS FLOW GRAPH
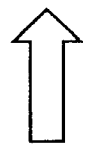
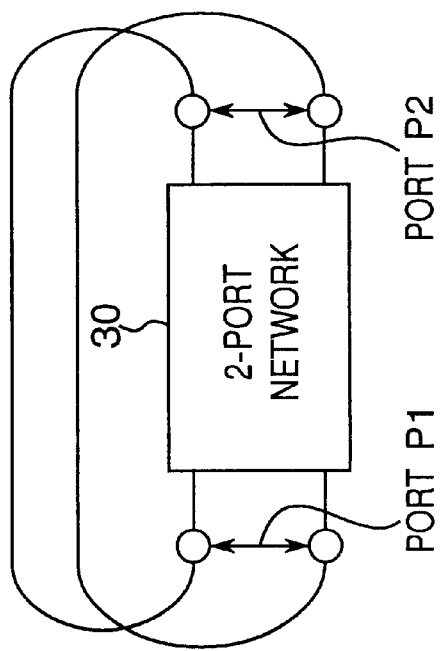
Fig.5A CLOSED-LOOP CONFIGURATION OF 2-PORT NETWORK 30

FLOW GRAPH FOR CLOSED-LOOP
CONFIGURATION OF 2-PORT NETWORK 30

INTRODUCTION OF VIRTUAL
PORT X

PORT P1 AND PORT P2 REDUCED TO
SINGLE PORT Y

FLOW GRAPH FROM
PORT X TO PORT Y

SECOND PREFERRED EMBODIMENT
FEEDBACK AMPLIFIER CIRCUIT 50

INTRODUCTION OF BEAK POINT BP

2-PORT NETWORK

THIRD PREFERRED EMBODIMENT
APPARATUS 200 FOR MEASURING AND DESIGNING ELECTRIC CIRCUIT

Fig.11 FOURTH PREFERRED EMBODIMENT

EXAMPLE VCO40

US 6,571,372 B2

METHOD AND APPARATUS FOR MEASURING AND DESIGNING ELECTRIC CIRCUIT BASED ON TWO-PORT NETWORK THEREOF, AND COMPUTER-READABLE RECORDING MEDIUM FOR RECORDING THE SAME

This application claims the benefit of Provisional application Ser. No. 60/178,437, filed Jan. 27, 2000.

BACKGROUND OF THE INVENTION

1. Field of the Invention

The present invention relates to a method and apparatus for measuring and designing an electric circuit and a computer-readable recording medium for recording the same. In particular, the present invention relates to a method and an apparatus for measuring an electric circuit such as an oscillator circuit, an amplifier circuit or the like based on S-parameters of a 2-port network thereof, a method and an apparatus for designing the electric circuit, a computer-readable recording medium recording a method of measuring the electric circuit, and a computer-readable recording medium for recording a method of designing the electric circuit.

2. Description of the Related Art

Oscillators in RF (Radio Frequency) and microwave frequencies remain to be rather mysterious circuit blocks, that is, their behaviors are not fully explained yet. In order to analyze a microwave oscillator, an approach of calculating oscillation parameters by introducing a virtual ground into an equivalent circuit of the microwave oscillator has been heretofore proposed (for exmaple, a prior art document 1, Stanilaw Alechno, "Analysis Method Characteristics Microwave Oscillators, Oscillator Analysis, Part 1", Microwave & RF, November 1997; a prior art document 2, Stanilaw Alechno, "Analysis Method Characteristics Microwave Oscillators, Oscillator Analysis, Part 2", Microwave & RP, December 1997; a prior art document 3, Stanilaw Alechno, "Analysis Method Characteristics Microwave Oscillators, Oscillator Analysis, Part 3", Microwave & RF, January 1998; and a prior art document 4, Stanilaw Alechno, "Analysis Method Characteristics Microwave Oscillators, Oscillator Analysis, Part 4", Microwave & RF, February 1998).

However, in particular, designing a wide-tuning voltage-controlled oscillator (hereinafter, a voltage-controlled oscillator is referred to as a VCO) still involves a lot of guesses, many printed-circuit board tunes, even with the help of today's highly sophisticated design tools. One problem in the designing process lies in the absence of analysis method that gives full insights into oscillation phenomenon represented in an easy-to-understand format.

Traditionally, all oscillators are classified into either a negative resistance oscillator (also known as a reflection oscillator) or a feedback oscillator. The criterion is whether or not there is an "obvious" feedback circuit. In RF and microwave frequencies, it becomes difficult to construct a feedback circuit without introducing excess phase shift. Therefore, almost all oscillators in the frequency range are classified as a negative resistance oscillator.

FIG. 1A is a circuit diagram showing a circuit of a negative resistance oscillator of the prior art, and FIG. 1B is a circuit diagram showing a reflection analysis model circuit, showing a method of analyzing the negative resistance oscillator.

As shown in FIG. 1B, the negative resistance oscillator is represented as a combination of an active element part 10 and a resonator part 20 of a passive element. For example, an active element of a transistor TR generates a negative resistance, and drives a passive element, which is usually a resonator RE. Simply speaking, when the negative resistance beats all losses in the resonator RE and the active element, oscillation builds up. Oscillation conditions for reflection analysis shown in FIG. 1B are expressed by the following Equations (1) and (2):

$$|\Gamma_A \cdot \Gamma_B| \geq 1 \quad (1);$$

and $$arg(\Gamma_A) = -arg(\Gamma_B) \quad (2),$$

where $\Gamma_A$ denotes a reflection coefficient of a port P11 when viewing the active element part 10 from the port P11, $\Gamma_B$ denotes a reflection coefficient of a port P12 when viewing the resonator part 20 from the port P12, and $arg(\cdot)$ denotes a phase or an angle of deviation of an argument thereof.

In the prior art, negative resistance analysis is so common, yet there are many questions in controversy as to the validity of this analysis. Also there are some oscillation parameters, like a loaded-Q, that cannot be derived from this analysis. The loaded-Q is one of the fundamental yet most important parameters because it dictates spectral purity (indicating how low phase noise is). Missing loaded-Q information when analyzing an oscillator prevents designers from a full understanding of their own design. In other words, there is such a problem that there is not yet any method of analyzing an RF circuit and a microwave circuit in a complete form.

SUMMARY OF THE INVENTION

It is an essential object of the present invention to overcome the foregoing problems, and also to provide a method and an apparatus for measuring an electric circuit, capable of measuring circuit parameters by analyzing an electric circuit such as an RF circuit, a microwave circuit or the like in a complete form using a method simpler than that of the prior art.

It is another object of the present invention to provide a method and an apparatus for designing an electric circuit, capable of designing circuit parameters by analyzing an electric circuit such as an RF circuit, a microwave circuit or the like in a complete form using a method simpler than that of the prior art.

It is a still further object of the present invention to provide a computer-readable recording medium for recording a program for measuring an electric circuit or a method of designing an electric circuit, capable of measuring or designing circuit parameters by analyzing an electric circuit such as an RF circuit, a microwave circuit or the like in a complete form using a method simpler than that of the prior art.

According to one aspect of the present invention, there is provided a method of measuring an electric circuit including the steps of:

entering an equivalent circuit of the electric circuit, the equivalent circuit comprising a plurality of elements respectively having element values thereof;

specifying a break point and a virtual ground in the entered equivalent circuit, the break point being for disconnecting an electric path for forming a closed-loop circuit;

generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

calculating S-parameters of the generated 2-port network; and calculating an open-loop transfer function of the electric circuit in accordance with the calculated S-parameters.

The above-mentioned method preferably further includes the step of calculating characteristic parameters of the electric circuit in accordance with the calculated open-loop transfer function.

Also, the above-mentioned method preferably further includes the steps of:

entering other element value of at least one of the plurality of elements of the entered equivalent circuit; and repeatedly executing the step of specifying, the step of generating and the two steps of calculating for the equivalent circuit of the electric circuit containing the other element value.

Further, the above-mentioned method preferably further includes the steps of:

entering other element value of at least one of the plurality of elements of the entered equivalent circuit; and repeatedly executing the step of specifying, the step of generating and the three steps of calculating for the equivalent circuit of the electric circuit containing the other element value.

In the above-mentioned method, the electric circuit is preferably an oscillator, and the characteristic parameters are at least one of an oscillation frequency, a gain margin, a phase margin and a loaded-Q.

In the above-mentioned method, the electric circuit is preferably an amplifier circuit, and the characteristic parameters are at least one of a maximum gain within a 3-dB bandwidth, the 3-dB bandwidth and a stability factor.

According to another aspect of the present invention, there is provided an apparatus for measuring an electric circuit comprising:

entering means for entering an equivalent circuit of the electric circuit, the equivalent circuit comprising a plurality of elements respectively having element values thereof;

specifying means for specifying a break point and a virtual ground in the entered equivalent circuit, the break point being for disconnecting an electric path for forming a closed-loop circuit;

generating means for generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

first calculating means for calculating S-parameters of the generated 2-port network; and second calculating means for calculating an open-loop transfer function of the electric circuit in accordance with the calculated S-parameters.

The above-mentioned apparatus preferably further comprises third calculating means for calculating characteristic parameters of the electric circuit in accordance with the calculated open-loop transfer function.

Also, the above-mentioned apparatus preferably further comprises outputting means for displaying or printing data with respect to the calculated open-loop transfer function.

Further, the above-mentioned apparatus preferably further comprises outputting means for displaying or printing data with respect to the calculated characteristic parameters.

According to a further aspect of the present invention, there is provided a method of designing an electric circuit including the steps of:

entering an equivalent circuit of the electric circuit, the equivalent circuit comprising a plurality of elements respectively having element values thereof;

specifying a break point and a virtual ground in the entered equivalent circuit, the break point being for disconnecting an electric path for forming a closed-loop circuit;

generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

calculating S-parameters of the generated 2-port network;

calculating an open-loop transfer function of the electric circuit in accordance with the calculated S-parameters;

calculating characteristic parameters of the electric circuit in accordance with the calculated open-loop transfer function; and specifying an element whose element value to be changed among the plurality of elements of the equivalent circuit of the electric circuit, and calculating element values of the equivalent circuit when the characteristic parameters of the electric circuit become desired characteristic parameters.

In the above-mentioned method, the electric circuit is preferably an oscillator, and the characteristic parameters are at least one of an oscillation frequency, and a loaded-Q.

In the above-mentioned method, the electric circuit is preferably an amplifier circuit, and the characteristic parameters are at least one of a maximum gain within a 3-dB bandwidth and the 3-dB bandwidth.

According to a still further aspect of the present invention, there is provided an apparatus for designing an electric circuit comprising:

entering means for entering an equivalent circuit of the electric circuit, the equivalent circuit comprising a plurality of elements respectively having element values thereof;

specifying means for specifying a break point and a virtual ground in the entered equivalent circuit, the break point being for disconnecting an electric path for forming a closed-loop circuit;

generating means for generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

first calculating means for calculating S-parameters of the generated 2-port network;

second calculating means for calculating an open-loop transfer function of the electric circuit in accordance with the calculated S-parameters;

third calculating means for calculating characteristic parameters of the electric circuit in accordance with the calculated open-loop transfer function; and fourth calculating means for specifying an element whose element value to be changed among the plurality of elements of the equivalent circuit of the electric circuit, and calculating element values of the equivalent circuit when the characteristic parameters of the electric circuit become desired characteristic parameters.

The above-mentioned apparatus preferably further comprises outputting means for displaying or printing at least one of the calculated open-loop transfer function of the electric circuit, the calculated characteristic parameters of the electric circuit, and the calculated element value of the equivalent circuit when the characteristic parameters of the electric circuit become the desired characteristic parameters.

According to a more still further aspect of the present invention, there is provided a computer-readable recording medium for recording a program for measuring an electric circuit, including the steps of:

entering an equivalent circuit of the electric circuit, the equivalent circuit comprising a plurality of elements respectively having element values thereof;

specifying a break point and a virtual ground in the entered equivalent circuit, the break point being for disconnecting an electric path for forming a closed-loop circuit;

generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

calculating S-parameters of the generated 2-port network; and calculating an open-loop transfer function of the electric circuit in accordance with the calculated S-parameters.

According to a still more further aspect of the present invention, there is provided a computer-readable recording medium for recording a program for designing an electric circuit, including the steps of:

entering an equivalent circuit of the electric circuit, the equivalent circuit comprising a plurality of elements respectively having element values thereof;

specifying a break point and a virtual ground in the entered equivalent circuit, the break point being for disconnecting an electric path for forming a closed-loop circuit;

generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

calculating S-parameters of the generated 2-port network;

calculating an open-loop transfer function of the electric circuit in accordance with the calculated S-parameters;

calculating characteristic parameters of the electric circuit in accordance with the calculated open-loop transfer function; and specifying an element whose element value to be changed among the plurality of elements of the equivalent circuit of the electric circuit, and calculating element values of the equivalent circuit when the characteristic parameters of the electric circuit become desired characteristic parameters.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 4A is a circuit diagram showing a 2-port network 30 showing the analysis method using an S-parameters transmission model according to the first preferred embodiment of the present invention;

FIG. 4B shows an S-parameters flow graph for the 2-port network 30 shown in FIG. 4A;

FIG. 5A is a circuit diagram showing a closed-loop configuration of the 2-port network 30 for the analysis method using the S-parameters transmission model;

FIG. 5B shows an S-parameters flow graph for the closed-loop configuration of the 2-port network 30 shown in FIG. 5A;

DETAILED DESCRIPTION OF THE PREFERRED EMBODIMENTS

Preferred embodiments according to the present invention will be described below with reference to the accompanying drawings.

First Preferred Embodiment

Figure 1B:
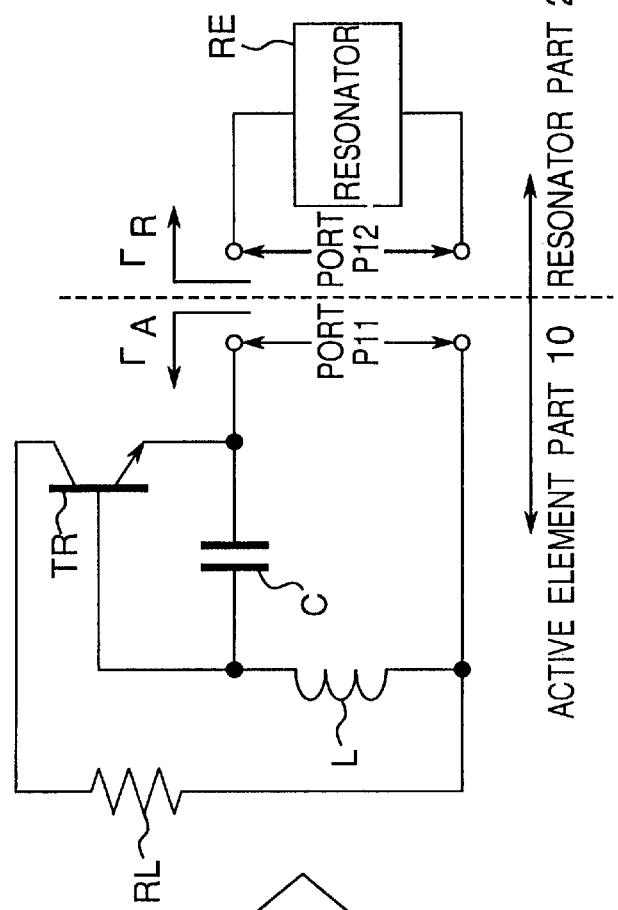
FIG. 1B is a circuit diagram showing a reflection analysis model circuit, showing a method of analyzing the negative resistance oscillator.
Figure 1A:
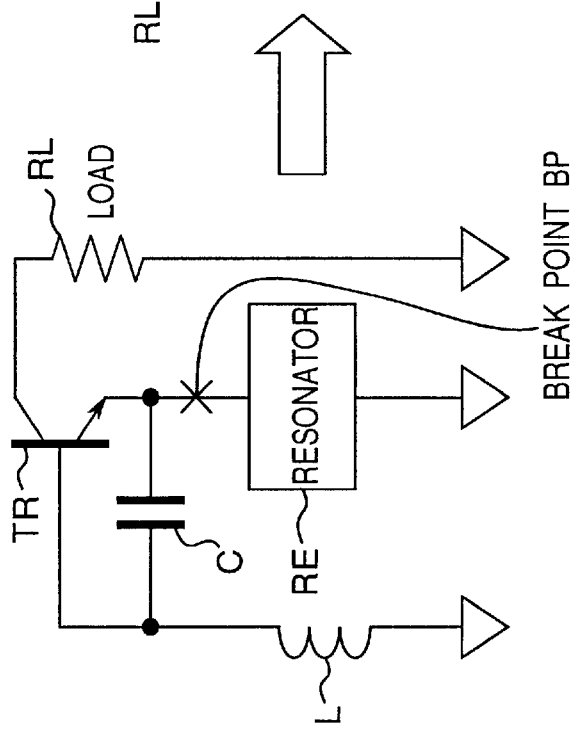
FIG. 1A is a circuit diagram showing a circuit of a negative resistance oscillator of the prior art.
Figure 2A:
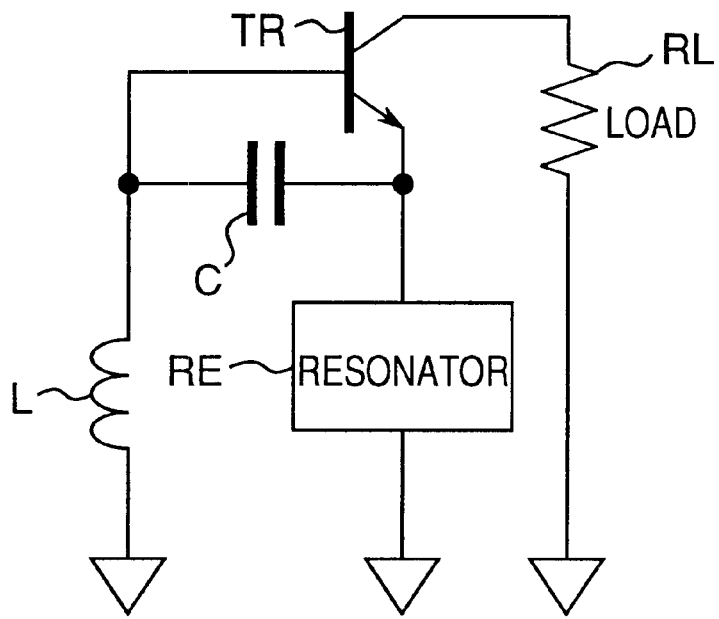
FIG. 2A is a circuit diagram showing a basic model, showing a first step of a method of analyzing a negative resistance oscillator according to a first preferred embodiment of the present invention.
Figure 2B:
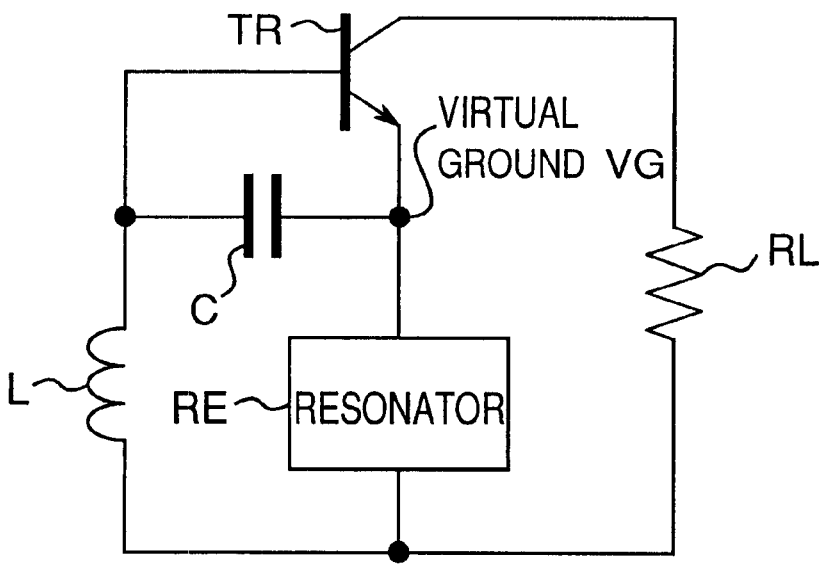
FIG. 2B is a circuit diagram showing a non-grounded model, showing a second step of the method of analyzing a negative resistance oscillator.
Figure 3A:
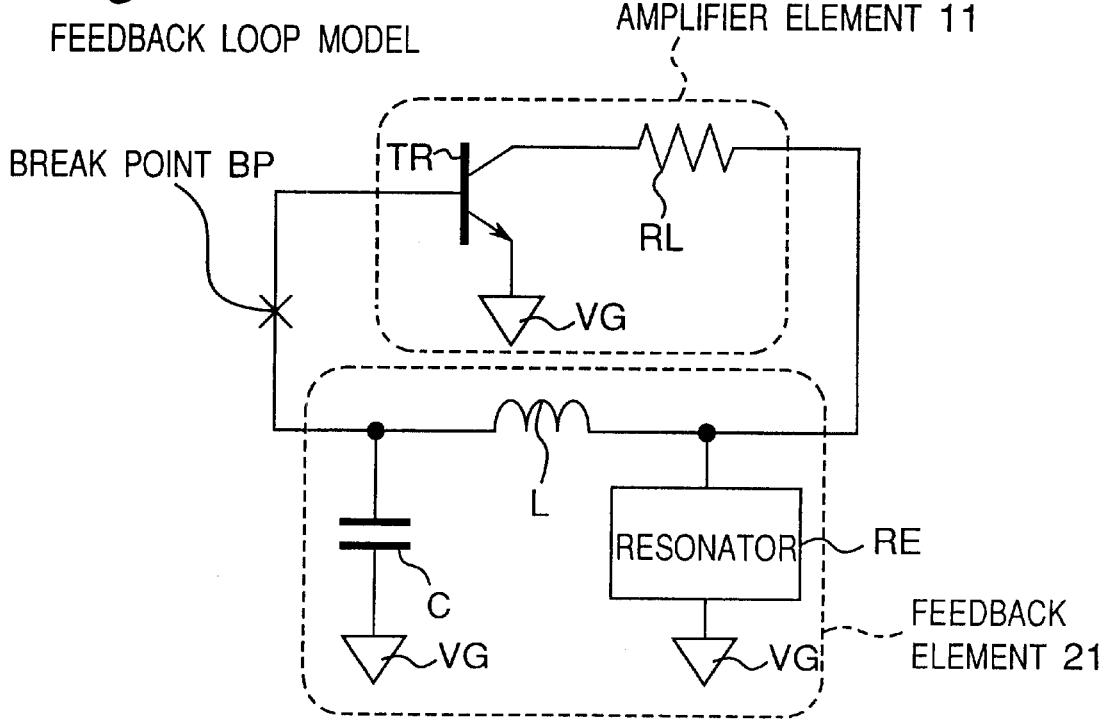
FIG. 3A is a circuit diagram showing a feedback loop model, showing a third step of the method of analyzing a negative resistance oscillator shown in FIGS. 2A and 2B.
Figure 3B:
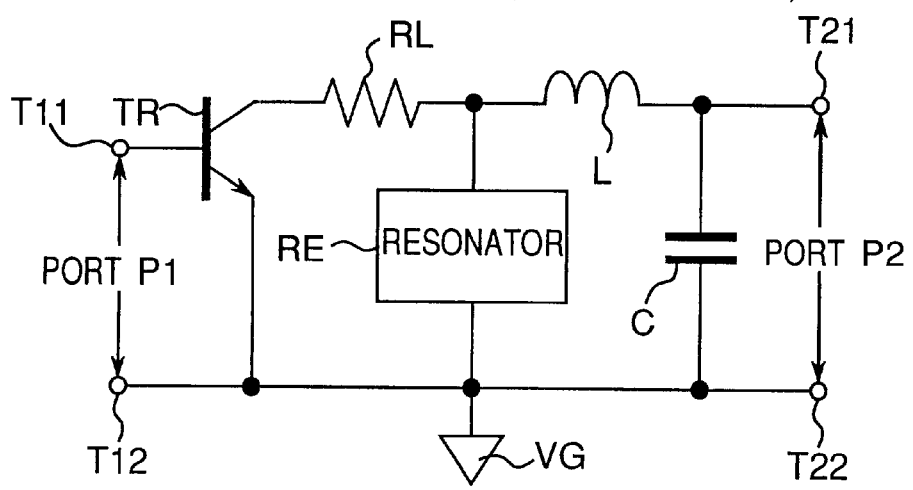
FIG. 3B is a circuit diagram showing a transmission analysis model (2-port network), showing a fourth step of the method of analyzing a negative resistance oscillator.

FIGS. 2A, 2B, 3A and 3B are circuit diagrams showing a method of analyzing a negative resistance oscillator according to a first preferred embodiment of the present invention. FIG. 2A is a circuit diagram showing a basic model, showing a first step of the analyzing method, and FIG. 2B is a circuit diagram showing a non-grounded model, showing a second step of the analyzing method. FIG. 3A is a circuit diagram showing a feedback loop model, showing a third step of the analyzing method, and FIG. 3B is a circuit diagram showing a transmission analysis model (2-port network), showing a fourth step of the analyzing method.

As compared with negative resistance analysis which is described in "Description of the Related Art", a feedback model is known to give better insights into oscillation phenomenon. Although building an "obvious" feedback circuit is almost impossible in RF and microwave frequencies, interpreting a negative resistance oscillator using the feedback model is possible. A preceding study has been done by Alencho, where a negative resistance oscillator is transformed into a "virtual" feedback oscillator by introducing a virtual ground (See the prior art documents 1 to 4). This transformation enables transmission analysis of RF and microwave oscillators that are otherwise treated with the above-mentioned negative resistance model.

FIGS. 2A, 2B, 3A and 3B show a transformation process of a negative resistance oscillator into a transmission analysis form. In the basic model shown in FIG. 2A, a negative resistance oscillator using a transistor TR of an active element is shown.

Referring to FIG. 2A, a base of the transistor TR is grounded through an inductor L, a capacitor C is connected between the base and an emitter of the transistor TR, and the emitter of the transistor TR is grounded through a resonator RE. A collector of the transistor TR is grounded through a load resistor RL. Then, the basic model shown in FIG. 2A is changed into the non-grounded model shown in FIG. 2B by connecting and thus eliminating all grounds of the basic model. Furthermore, the emitter of the transistor TR shown in FIG. 2B is specified as a virtual ground VG. Thus, as shown in FIG. 3A, an amplifier element 11 comprises the transistor TR and the load resistor RL, while a feedback element 21 of a n-type circuit comprises the capacitor C, the inductor L, and the resonator RE. That is, a signal outputted from an output terminal of the amplifier element 11 is fed back to an input terminal of the amplifier element 11 through the feedback element 21, and the circuit oscillates when the circuit satisfies oscillation conditions to be described in detail later.

The feedback loop model shown in FIG. 3A is changed into the transmission analysis model shown in FIG. 3B in the following manner. That is, a connecting point of a closed-loop circuit between the base of the transistor TR and one end of the capacitor C is specified as a break point BP, and disconnection takes place at the break point BP. By disconnecting an electric path of the closed-loop circuit at the specified break point BP in the above-mentioned equivalent circuit, first and second terminals that are two ends of the electric path are formed. Thus, a 2-port network can be generated, which has a first port P1 comprised of the first terminal and the specified virtual ground VG, and has a second port P2 comprised of the second terminal and the specified virtual ground VG. In other words, the above-mentioned transmission analysis model constitutes the 2-port network, which has the port P1 comprised of a terminal T11 connected to the base of the transistor TR and a terminal T12 of the virtual ground VG, and also has the port P2 comprised of terminals T21 and T22 located at both ends of the capacitor C, where the terminal T22 is the virtual ground VG.

FIG. 3B shows a form of the transmission analysis model. In the preferred embodiment, the form of the transmission analysis model will be used hereinafter. The oscillator can obtain all parameters for transmission analysis since the oscillator is the 2-port network. The oscillator can also calculate S-parameters for the ports.

Next, oscillation conditions for an S-parameters transmission model will be described with reference to FIG. 4A showing a circuit diagram showing a 2-port network 30 showing an analysis method using the S-parameters transmission model. The important thing to consider here is that, in the actual oscillator shown in FIG. 3B, the port P2 is terminated by the port P1, and vise versa, to form a feedback loop. In addition, the ports P1 and P2 are not necessarily impedance-matched to each other. For the simplest case, if the ports P1 and P2 are impedance-matched to 50 Ω and $|S_{21}| >> |S_{12}|$, the oscillation conditions will be as simple as the following Equations (3) and (4):

$$|S_{21}| \geq 1 \tag{3},$$

and $$arg(S_{21}) = 0 \tag{4},$$

where $S_{21}$ and $S_{12}$ denote S-parameters for the 2-port network 30 shown in FIG. 3B or FIG. 4A.

Furthermore, oscillation conditions for a general transmission model will be described with reference to FIGS. 4A and 4B and FIGS. 5A and 5B. FIG. 4A is a circuit diagram showing the 2-port network 30 showing the analysis method using the S-parameters transmission model according to the first preferred embodiment of the present invention, and FIG. 4B shows an S-parameters flow graph for the 2-port network 30 shown in FIG. 4A. FIG. 5A is a circuit diagram showing a closed-loop configuration of the 2-port network 30 for the analysis method using the S-parameters transmission model, and FIG. 5B shows an S-parameters flow graph for the closed-loop configuration of the 2-port network 30 shown in FIG. 5A. In these flow graphs, $a_n$ denotes incident waves and $b_n$ denotes reflected waves, where "n" denotes a port number.

First of all, the 2-port network 30 shown in FIG. 4A is shown in FIG. 4B in a form of the S-parameters flow graph. In order to analyze transmission characteristics of the 2-port network 30, an open-loop gain for the closed-loop configuration shown in FIG. 5A should be defined. The open-loop gain is defined by manipulating the S-parameters flow graph. The closed-loop configuration of the 2-port network 30 shown in FIG. 5A is shown in FIG. 5B in a form of the S-parameters flow graph.

Figure 6A:
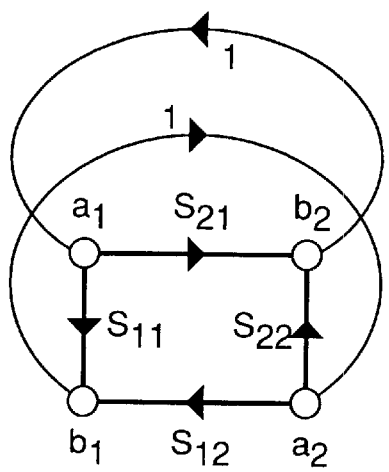
FIG. 6A shows a flow graph for the closed-loop configuration of the 2-port network 30, showing a first step of the analysis method using the S-parameters transmission model according to the first preferred embodiment of the present invention.
Figure 6C:
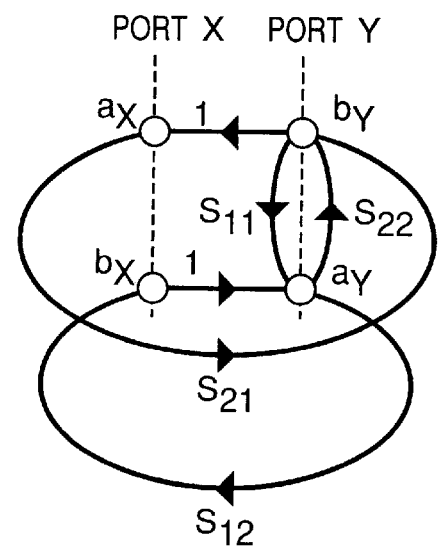
FIG. 6C shows a flow graph for illustrating introduction of a virtual port X, showing a third step of the analysis method.
Figure 6B:
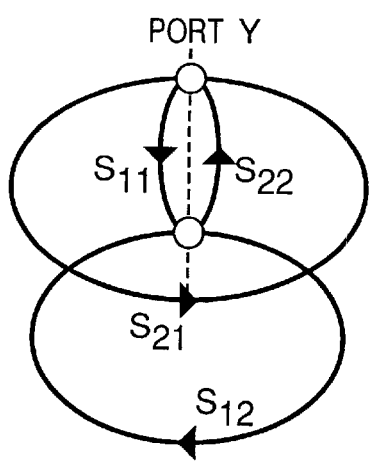
FIG. 6B shows a flow graph showing a second step of the analysis method, which is obtained when a port P1 and a port P2 are reduced to a single port Y in the flow graph shown in FIG. 6A.
Figure 6D:
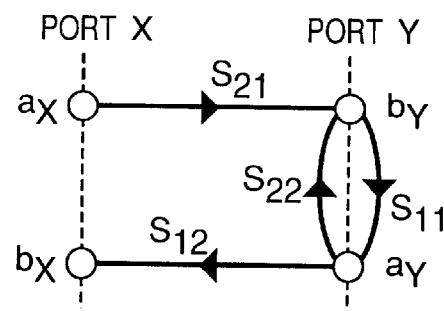
FIG. 6D shows a flow graph from the port X to the port Y, showing a fourth step of the analysis method.

FIGS. 6A, 6B, 6C and 6D show the details of manipulation thereof. FIG. 6A shows a flow graph for the closed-loop configuration of the 2-port network 30, showing a first step of the analysis method using the S-parameters transmission model according to the first preferred embodiment of the present invention. FIG. 6B shows a flow graph showing a second step of the analysis method, which is obtained when the port P1 and the port P2 are reduced to a single port Y in the flow graph shown in FIG. 6A. FIG. 6C shows a flow graph for illustrating the introduction of a virtual port X, showing a third step of the analysis method. FIG. 6D shows a flow graph from the port X to the port Y, showing a fourth step of the analysis method.

FIG. 6A shows a starting point, which is the flow graph for the closed-loop configuration of the 2-port network. Referring to FIG. 6A, the port P1 and the port P2 can be reduced to a single port called the port Y shown in FIG. 6B, since each of coefficients of branches connecting the two ports P1 and P2 is equal to one. In the next step, as shown in FIG. 6C, the port X of a virtual port is introduced. The port X does not physically exist, and the port X is an imaginary port impedance-matched perfectly to 50 Ω. Also, the port X does not alter signal flow at all. With the ports X and Y introduced, the loop can be opened up (See FIG. 6D) and an open-loop transfer function can be calculated, since both the ports X and Y are terminated by 50 Ω and therefore independent of each other.

The open-loop transfer function consists of two parts: a forward transmission term and a reverse transmission term, reflecting such a fact that either direction of signal flow can result in oscillation. The forward and reverse transmission terms can be expressed as $b_Y/a_X$ and $b_X/a_Y$, respectively. Both the terms must be considered in order to obtain oscillation conditions. There is a useful rule known as the well-known Mason's theorem or rule (or the well-known non-touching loop rule) to solve a value of any node in the 2-port network 30 (for example, See a prior art document 5, "S-parameter Design", Hewlett-Packard Application Note 154, April 1972).

The Mason's theorem will be now described briefly. The Mason's theorem determines a ratio T of two variables, depending on an independent variable:

$$T = \frac{P_1 \cdot \left|1 - \sum L(1)^{(1)} + \sum L(2)^{(1)} - \ldots\right| + P_2 \cdot \left|1 - \sum L(1)^{(2)} + \ldots\right| + \ldots}{1 - \sum L(1) + \sum L(2) - \sum L(3) + \ldots}, \quad (5)$$

where $P_1$ and $P_2$, etc., denote various paths connecting these variables. The term $\Sigma L(1)^{(1)}$ represents the sum of all first-order loops that do not touch a first path between the variables. The term $\Sigma L(2)^{(1)}$ represents the sum of all second-order loops that do not touch the first path, and so on down the line. The term $\Sigma L(1)^{(2)}$ represents the sum of all first-order loops that do not touch a second path. Therefore, a denominator in the above Equation (5) is a function of network geometry. It is simply one minus the sum of first-order loops, plus the sum of second-order loops, minus the sum of third-order loops, plus and so on.

The ratio of two variables can be determined by using the Mason's rule. Applying the rule to $b_Y/a_X$ and $b_X/a_Y$ yields the following Equations (6) and (7):

$$\frac{b_Y}{a_X} = \frac{S_{21}}{1 - S_{11} \cdot S_{22}}, \quad (6)$$

and $$\frac{b_X}{a_Y} = \frac{S_{12}}{1 - S_{11} \cdot S_{22}}. \quad (7)$$

A complete open-loop transfer function G, the following Equation (8), is given by subtracting the above Equation (7) from the above Equation (6):

$$G = \frac{b_Y}{a_X} - \frac{b_X}{a_Y} = \frac{S_{21} - S_{12}}{1 - S_{11} \cdot S_{22}}. \quad (8)$$

For most oscillators, the open-loop transfer function can approximate $b_Y/a_X$ in the the Equation (6) since $S_{12}$ is so small that a signal flowing backward (indicating $b_X/a_Y$ in the Equation (7)) can be ignored. Therefore, in order to make the analysis simple, the forward transmission term $b_Y/a_X$ in the Equation (6) is substituted for the open-loop transfer function G expressed by the Equation (5). Therefore, the oscillation conditions are expressed by the following Equations (9) and (10):

$$\left|\frac{S_{21}}{1 - S_{11} \cdot S_{22}}\right| \geq 1, \quad (9)$$

and $$\arg\left(\frac{S_{21}}{1 - S_{11} \cdot S_{22}}\right) = 0. \quad (10)$$

Both the conditions must be met for oscillation to grow up. These conditions are simply the statement that magnitude of the forward transmission term $b_Y/a_X$ in the Equation (6) must be equal to or greater than unity with a phase shift of 360° (or 0°).

As described above, the method of analyzing an oscillator according to the first preferred embodiment can measure circuit parameters by analyzing an electric circuit such as an RF circuit, a microwave circuit or the like in a complete form using a method simpler than that of the prior art.

Second Preferred Embodiment

Figure 7A:
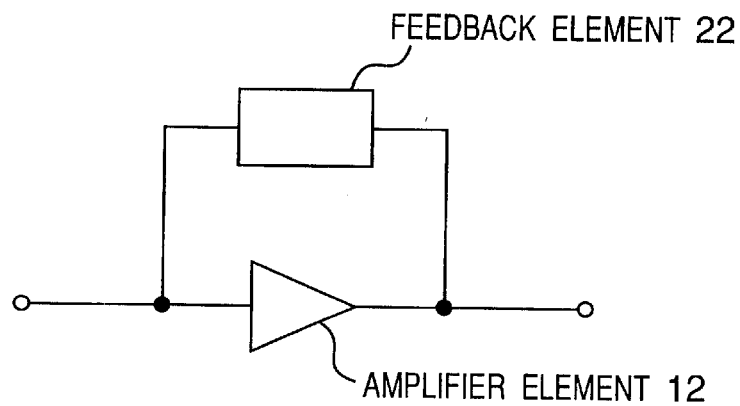
FIG. 7A is a block diagram showing a feedback amplifier circuit 50, showing an example of an analysis method according to a second preferred embodiment of the present invention.
Figure 7B:
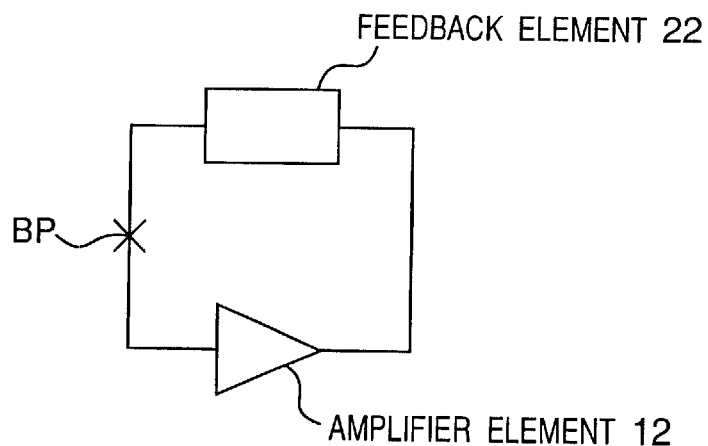
FIG. 7B is a block diagram showing introduction of a break point BP in the feedback amplifier circuit 50 shown in FIG. 7A.
Figure 7C:
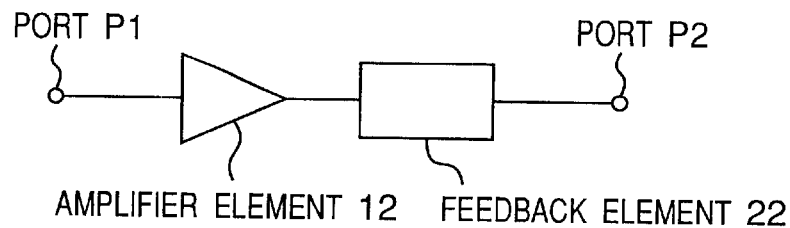
FIG. 7C is a block diagram showing a 2-port network obtained through introduction of the break point BP shown in FIG. 7B.

FIG. 7A is a block diagram showing a feedback amplifier circuit 50, showing an example of an analysis method according to a second preferred embodiment of the present invention. FIG. 7B is a block diagram showing introduction of a break point BP in the feedback amplifier circuit 50 shown in FIG. 7A. FIG. 7C is a block diagram showing a 2-port network obtained through the introduction of the break point BP shown in FIG. 7B.

In the first preferred embodiment, the description has been given with regard to an example of a negative resistance oscillator. In the second preferred embodiment, the description is given with regard to an example of a feedback amplifier circuit. As shown in FIG. 7A, the feedback amplifier circuit 50 comprises an amplifier element 12 and a feedback element 22. A signal outputted from an output terminal of the amplifier element 12 is fed back to an input terminal of the amplifier element 12 through the feedback element 22, and the feedback amplifier circuit 50 does not oscillate. Thus, the feedback amplifier circuit 50 is designed so as to realize a stable amplification operation.

In the second preferred embodiment, as shown in FIG. 7B, the break point BP is introduced at a connecting point between the input terminal of the amplifier element 12 and one end of the feedback element 22, and thus disconnection takes place therebetween. Thus, the 2-port network shown in FIG. 7C can be obtained. Based on the 2-port network, transmission analysis using S-parameters can be performed in a manner similar to that of the first preferred embodiment. Therefore, the method of analyzing an amplifier circuit according to the second preferred embodiment can measure circuit parameters by analyzing an electric circuit such as an RF circuit, a microwave circuit or the like in a complete form using a method simpler than that of the prior art.

Third Preferred Embodiment

Figure 8:
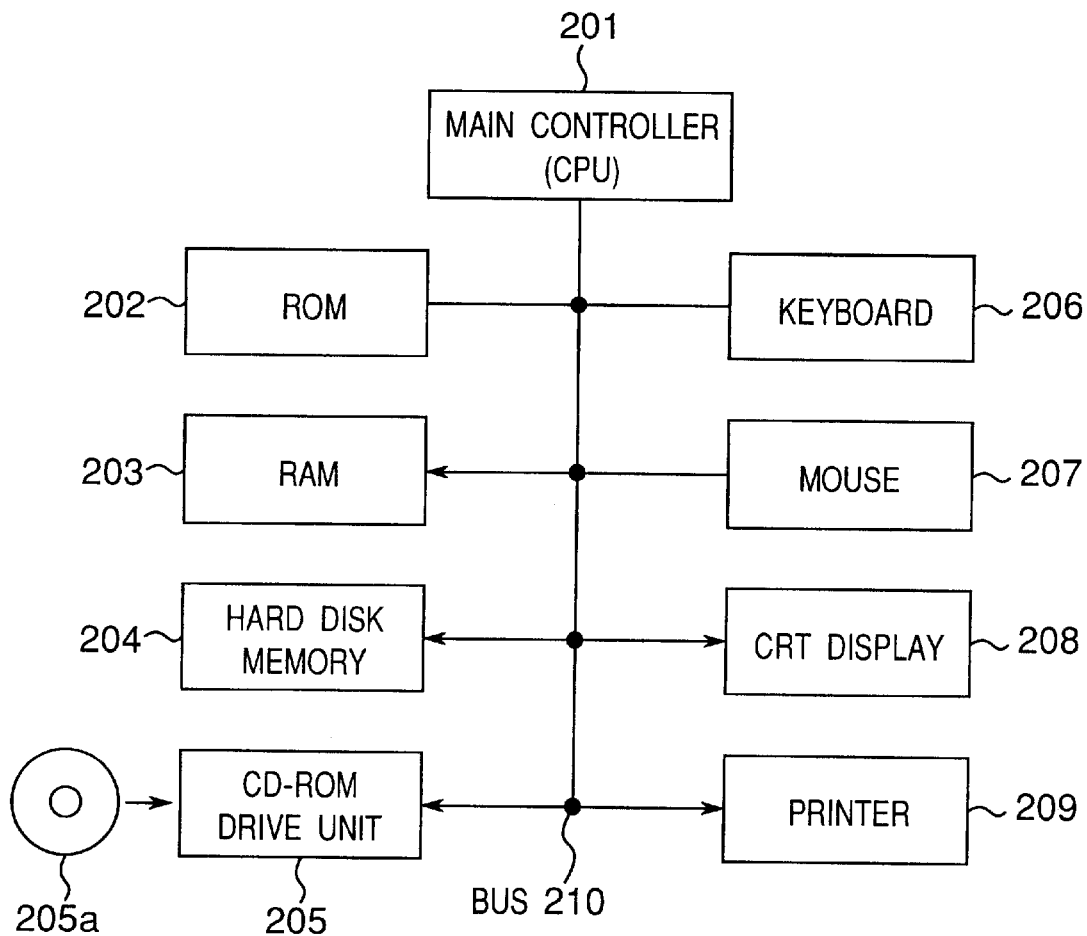
FIG. 8 is a block diagram showing a configuration of an apparatus 200 for measuring and designing an electric circuit according to a third preferred embodiment of the present invention.

FIG. 8 is a block diagram showing a configuration of an apparatus 200 for measuring and designing an electric circuit according to a third preferred embodiment of the present invention. The apparatus 200 for measuring and designing an electric circuit is characterized by that the apparatus 200 executes a process for measuring an electric circuit shown in FIG. 9, and also executes a process for designing an electric circuit shown in FIG. 10, by using the transmission analysis using S-parameters disclosed in the first and second preferred embodiments.

Figure 9:
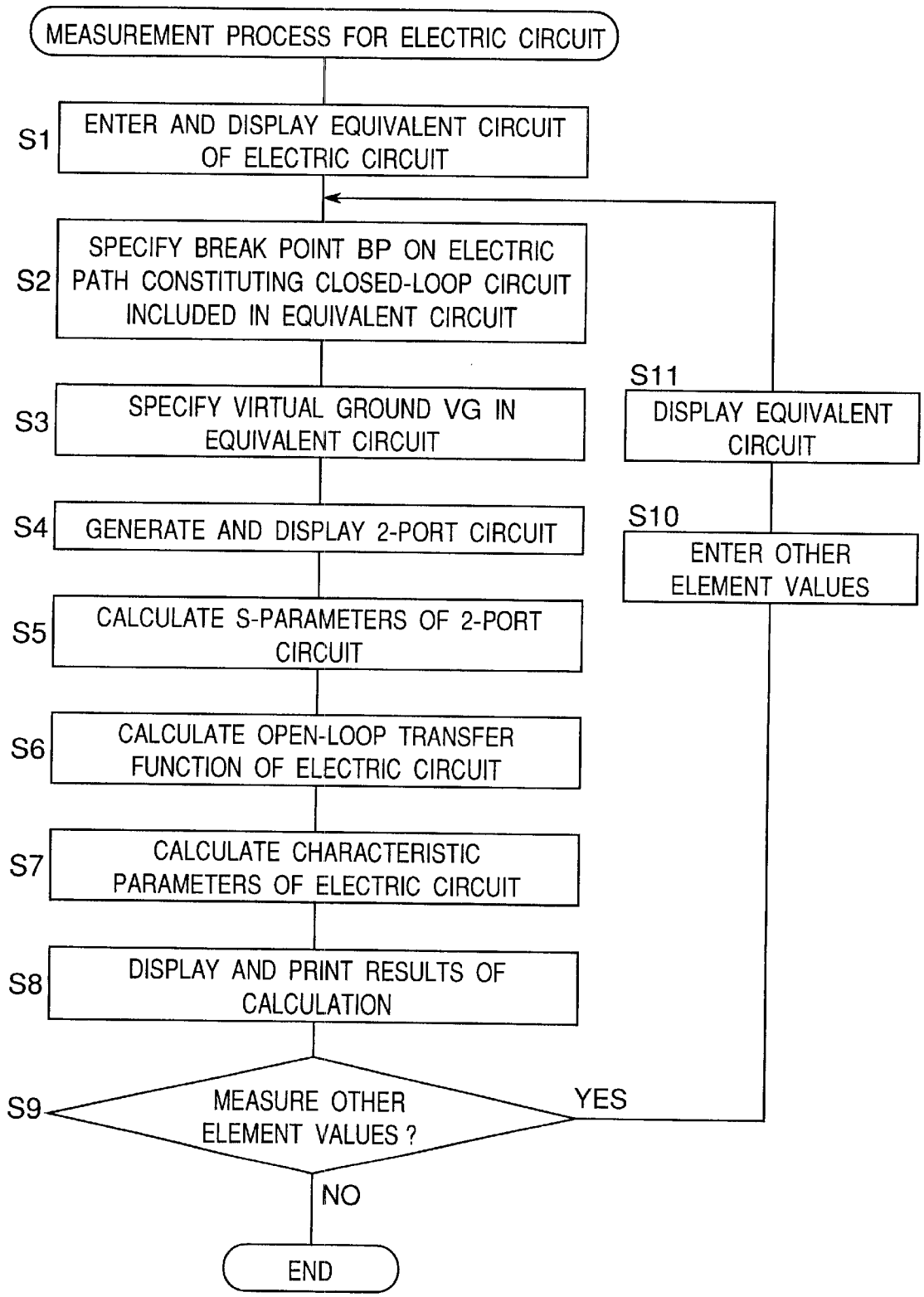
FIG. 9 is a flow chart showing a process for measuring an electric circuit, which is executed by a main controller 201 shown in FIG. 8.
Figure 10:
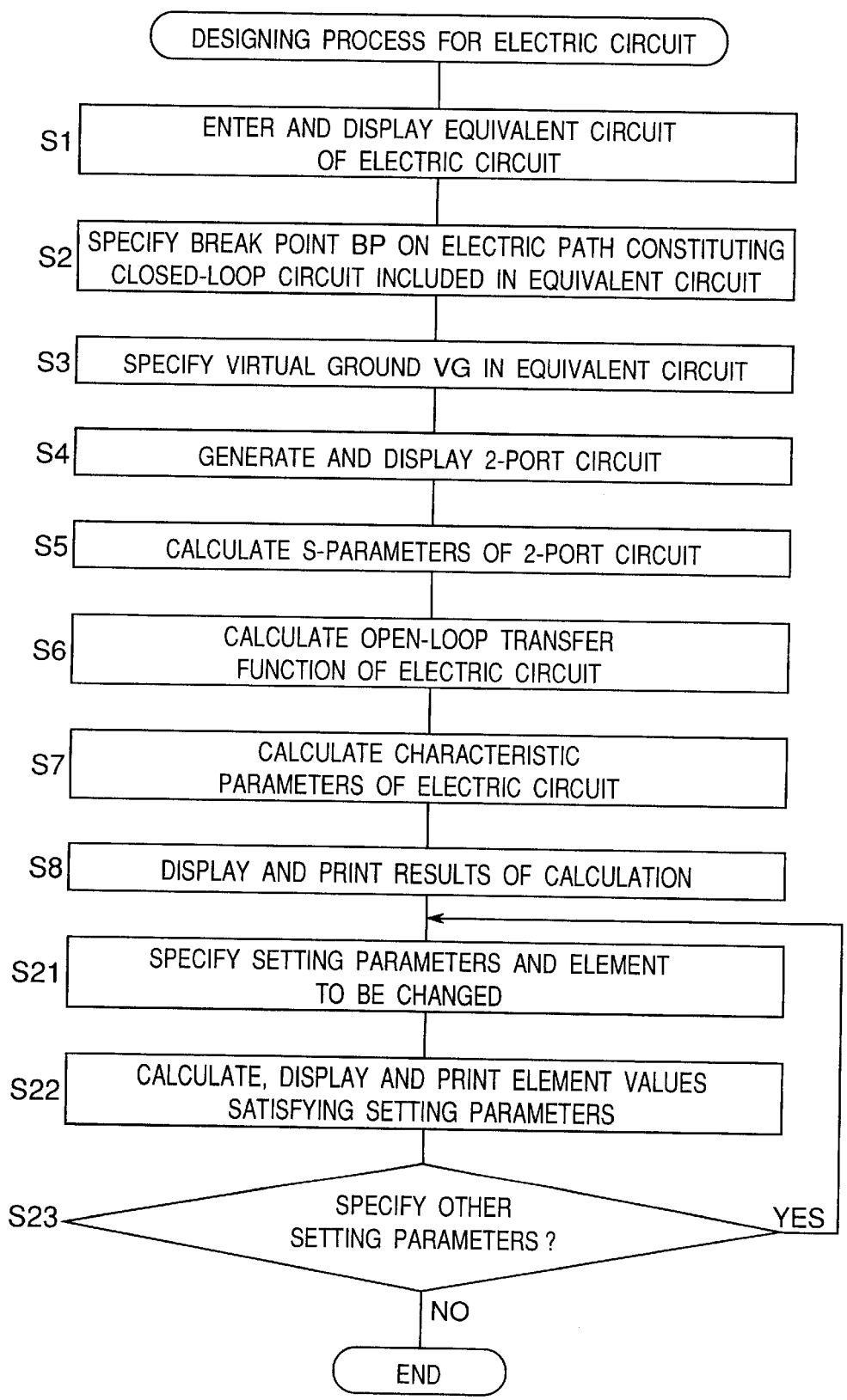
FIG. 10 is a flow chart showing a process for designing an electric circuit, which is executed by the main controller 201 shown in FIG. 8.

First of all, the configuration of the apparatus 200 for measuring and designing an electric circuit will be described with reference to FIG. 8. The apparatus 200 for measuring and designing an electric circuit comprises:

(a) a CPU (central processing unit) 201 of a computer for computing and controlling the operation and process of the apparatus 200 for measuring and designing an electric circuit;

(b) a ROM (read-only memory) 202 for storing a basic program such as an operation program, and data required to execute the basic program;

(c) a RAM (random access memory) 203 for operating as a working memory of the CPU 201 and temporarily storing parameters and data necessary for the measuring process and the designing process;

(d) a hard disk memory 204 for storing a program containing the process for measuring an electric circuit shown in FIG. 9 and the process for designing an electric circuit shown in FIG. 10, and so on;

(e) a CD-ROM drive unit 205 for reading out program data from a CD-ROM 205*a* storing the program containing the process for measuring an electric circuit shown in FIG. 9 and the process for designing an electric circuit shown in FIG. 10, and transferring the program data to the hard disk memory 204 or the like;

(f) a keyboard 206 for entering predetermined data and instruction commands;

(g) a mouse 207 for entering predetermined data and instruction commands on a CRT display 208;

(h) a CRT display 208 for displaying data processed by the CPU 201, results of predetermined analysis including an electric circuit, a screen for giving instructions for setting, and so on; and (i) a printer 209 for printing the data processed by the CPU 201, the results of predetermined analysis, and so on.

These circuits 201 to 209 are connected to each other through a bus 210.

FIG. 9 is a flow chart showing a process for measuring an electric circuit, which is executed by the main controller 201 shown in FIG. 8. The electric circuit is an oscillator as shown in the first preferred embodiment, or an amplifier circuit as shown in the second preferred embodiment.

Referring to FIG. 9, first of all, in step S1, an equivalent circuit of an electric circuit, which contains a status of connection of a plurality of elements of the equivalent circuit of the electric circuit comprising a plurality of elements respectively having element values thereof, is entered by using the keyboard 206 or the mouse 207, and the equivalent circuit is displayed on the CRT display 208. In step S2, a break point BP at which an electric path is to be disconnected is specified on the electric path constituting a closed-loop circuit included in the displayed equivalent circuit, by using the mouse 207. Then, in step S3, a virtual ground VG is specified on the displayed equivalent circuit by using the mouse 207. In response to this, in step S4, a 2-port circuit that is a 2-port network is generated and displayed as shown in FIG. 3B, for example. In this step, first and second terminals, two ends of the electric path, are formed by disconnecting the electric path at the specified break point BP in the displayed equivalent circuit. Thus, a 2-port circuit of a 2-port network is generated, which has a first port comprised of the first terminal and the specified virtual ground, and has a second port comprised of the second terminal and the specified virtual ground. Furthermore, in step S5, S-parameters of the 2-port circuit are calculated by using a method of calculating a well-known network analyzer circuit on the basis of the displayed 2-port circuit. After that, in step S6, an open-loop transfer function G of the electric circuit is calculated.

Subsequently, in step S7, characteristic parameters of the electric circuit are calculated. If the electric circuit is an oscillator, the characteristic parameters include frequency characteristics of magnitude and phase of an open-loop transfer function G, an oscillation frequency, a stability factor, a loaded-Q, a gain margin, a phase margin, a frequency deviation per one degree, and so on. In the present invention, the characteristic parameters of the oscillator can include at least one of these parameters. If the electric circuit is an amplifier circuit, the characteristic parameters include frequency characteristics of magnitude and phase of an open-loop transfer function G, a 3-dB bandwidth, the lowest and highest frequencies of the 3-dB bandwidth, the maximum gain within the 3-dB bandwidth, a stability factor, and so on. In the present invention, the characteristic parameters of the amplifier circuit can include at least one of these parameters.

Furthermore, in step S8, the results of the calculated open-loop transfer function and characteristic parameters are displayed on the CRT display 208 in numerical form and/or graphical form, and the displayed results are printed by using the printer 209. Then, in step S9, whether or not other element value(s) is/are measured is judged. If NO, the measuring process is ended. If YES, the process proceeds to step S10. In step S10, other element value(s) of at least one of a plurality of elements of the equivalent circuit is/are entered by using the keyboard 206. In step S11, the equivalent circuit is displayed. Furthermore, the processes of step S2 and the following steps are repeated for other element value(s) of the equivalent circuit. In this manner, various characteristic parameters about a desired electric circuit are calculated, and thereafter the calculated characteristic parameters can be displayed and printed.

FIG. 10 is a flow chart showing a process for designing an electric circuit, which is executed by the main controller 201 shown in FIG. 8. The same steps as the steps in FIG. 9 are indicated by the same step numbers.

Referring to FIG. 10, the processes from step S1 to step S8 are executed in a manner similar to that of FIG. 9. After step S8, in step S21, setting parameters and an element having an element value to be changed are specified in the equivalent circuit displayed on the CRT display 208, by using the mouse 207 or the keyboard 206. In step S22, element values satisfying the setting parameters are calculated, the calculated element values are displayed on the CRT display 208 in numerical form and/or graphical form, and the displayed element values are printed by using the printer 209. When an electric circuit is an oscillator, the setting parameters include an oscillation frequency, conditions for a stability factor, conditions for a loaded-Q, and so on. When an electric circuit is an amplifier circuit, the setting parameters include the lowest and highest frequencies of a 3-dB bandwidth, maximum gain within the 3-dB bandwidth, and so on. After the above-mentioned step S22, in step S23, whether or not other setting parameters are specified is judged. If NO, the designing process is ended. If YES, the process returns to step S21. In step S21, other setting parameters and other elements to be changed are specified in the equivalent circuit displayed on the CRT display 208, by using the mouse 207 or the keyboard 206. Thus, the process of step S22 is repeated. In this manner, element values of an electric circuit satisfying setting parameters of a desired electric circuit are calculated, and thereafter, the calculated element values can be displayed and printed.

As described above, the apparatus for measuring and designing an electric circuit according to the preferred embodiment can easily, accurately measure characteristic parameters of an electric circuit such as an oscillator, an amplifier circuit or the like, can calculate element values of an electric circuit for satisfying desired setting parameters, and can easily and accurately design an electric circuit.

In the above-described preferred embodiment, the CRT display 208 is used. However, the present invention is not limited to this, and any other display device such as a liquid crystal display or a plasma display may be used. In the above-described preferred embodiment, the apparatus comprises the computer-readable CD-ROM drive unit 205 for reading out a program from the CD-ROM 205a storing the program. However, the present invention is not limited to this, the apparatus may comprise a drive unit for reading out a program from any other type of computer-readable recording medium such as a CD-R, a CD-RW, an MO or a DVD, which stores the program.

In the above-described flow charts shown in FIGS. 9 and 10, steps S2 and S3 may be replaced with each other.

Fourth Preferred Embodiment

Figure 11:
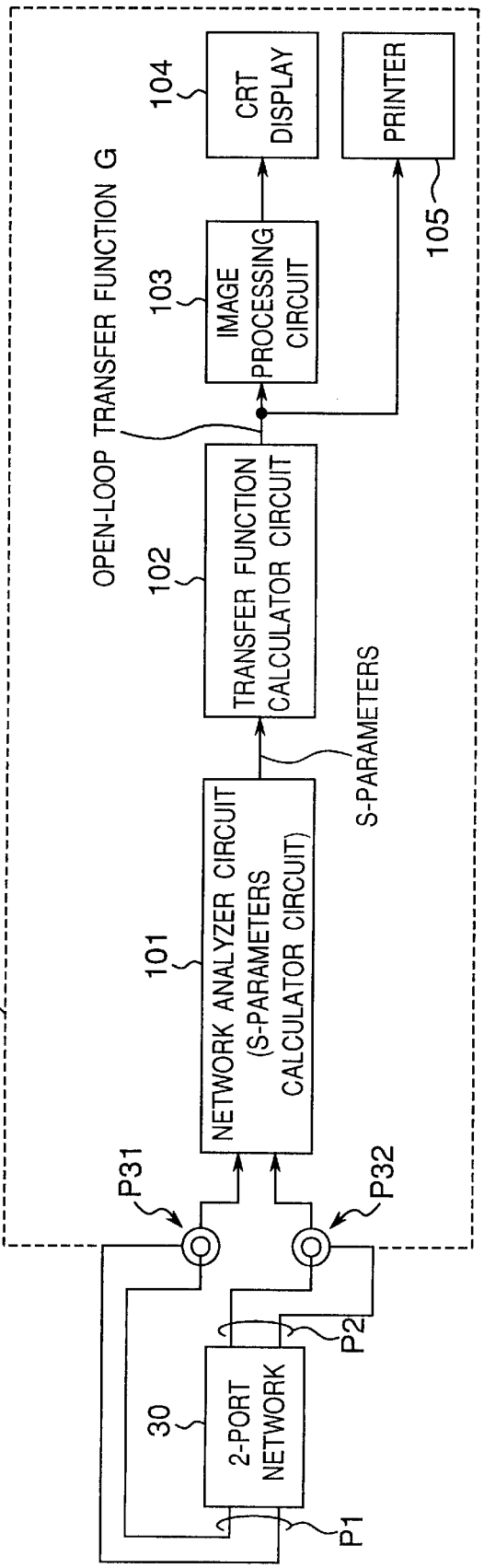
FIG. 11 is a block diagram showing a configuration of an improved network analyzer apparatus 100 for measuring the 2-port network 30 according to a fourth preferred embodiment of the present invention.

FIG. 11 is a block diagram showing a configuration of an improved network analyzer apparatus 100 for measuring the 2-port network 30 according to a fourth preferred embodiment of the present invention. The network analyzer apparatus 100 according to the fourth preferred embodiment is characterized by that the network analyzer apparatus 100 is incorporated in the apparatus 200 for measuring and designing an electric circuit according to the third preferred embodiment.

Referring to FIG. 11, the port P1 of the 2-port network 30 is connected to a first measurement port P31 of the network analyzer apparatus 100, whereas the port P2 of the 2-port network 30 is connected to a second measurement port P32 of the network analyzer apparatus 100. The network analyzer apparatus 100 comprises a network analyzer circuit 101 including an S-parameters calculator circuit, a transfer function calculator circuit 102, an image processing circuit 103, a CRT display 104, and a printer 105.

The network analyzer circuit 101 calculates S-parameters of the 2-port network 30 connected to the circuit 101, and outputs data of the calculated S-parameters to the transfer function calculator circuit 102. In response to this, the transfer function calculator circuit 102 calculates an open-loop transfer function G in accordance with the input data of the S-parameters, and calculates frequency characteristics of magnitude and phase of the open-loop transfer function G and vector representation of the open-loop transfer function G. Then, the transfer function calculator circuit 102 outputs resultant calculated data to the image processing circuit 103 and the printer 105. In response to this, the printer 105 prints the calculated data in numerical form and/or graphical form. In accordance with the input calculated data, the image processing circuit 103 converts the calculated data into an image signal to be displayed on the CRT display 104 in numerical form and/or graphical form, and outputs the image signal to the CRT display 104. The CRT display 104 displays the image signal.

As described above, the improved network analyzer apparatus 100 according to the preferred embodiment can easily, accurately measure characteristic parameters of the 2-port network 30, which is an electric circuit such as an oscillator or an amplifier circuit.

EXAMPLE

In the following example, the description is given with regard to the results of measurement of a VCO 40 shown in FIG. 12 using the measuring process according to the above-mentioned preferred embodiment.

Figure 12:
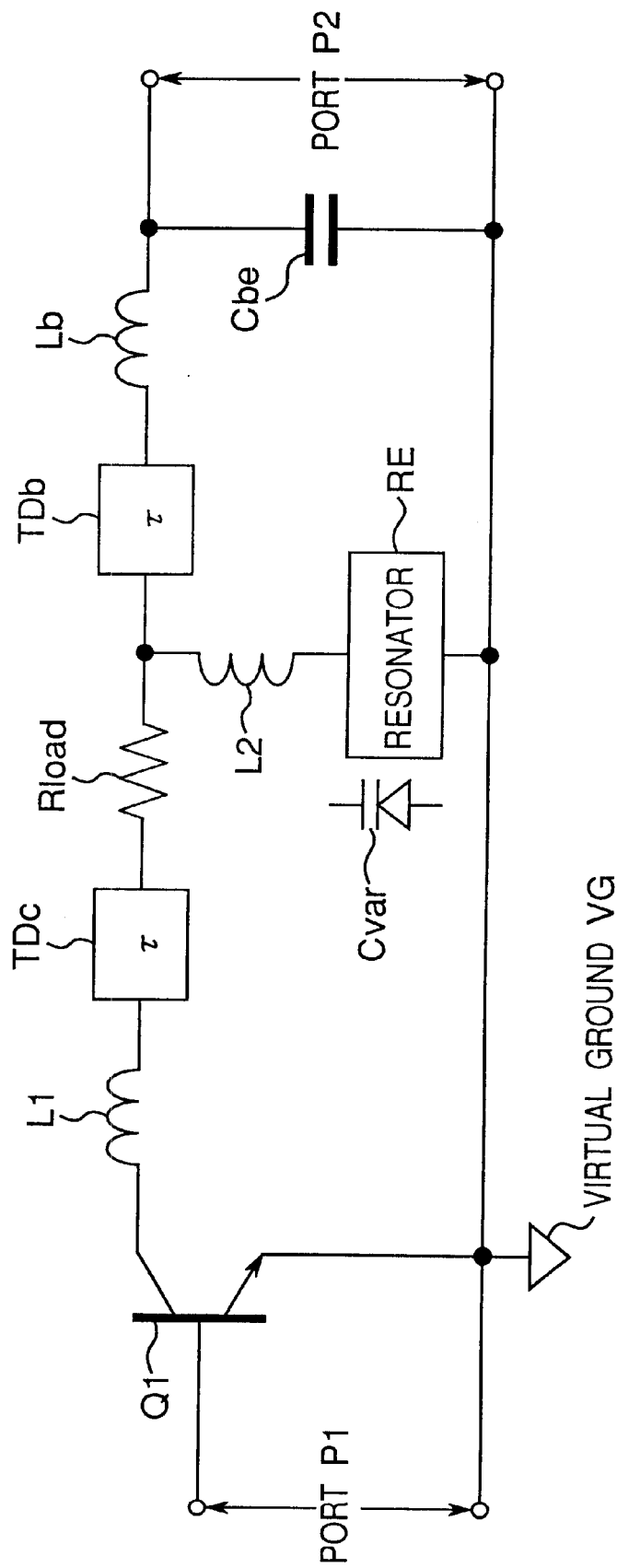
FIG. 12 is a circuit diagram showing a voltage-controlled oscillator (VCO) 40 according to an example of the present invention.

A circuit diagram shown in FIG. 12 has been already transformed into a transmission analysis form with a virtual ground VG selected at an emitter of a transistor Q1. The VCO 40 actually has a physical circuit of the Colpitts oscillation, as shown in FIG. 2A.

In the circuit diagram shown in FIG. 12, TDc and TDb represent time delay introduced by an actual ground that is constructed with a printed-circuit board (not shown), respectively. The time delay TDc accounts for ground delay between a collector and the emitter of the transistor Q1, and the time delay TDb accounts for ground delay between the emitter and a base of the transistor Q1. Resistance load Rload is the resistance load RL shown in FIG. 2A. Inductors L1 and L2 represent parasitic inductance in series with surface-mount components, respectively. An inductor Lb is base inductance, which is one of the essential components of the Colpitts configuration. A capacitor Cbe is another building block of the Colpitts configuration and placed actually between the base and emitter of the transistor Q1. However, in many RF and microwave oscillators, a capacitance is located at a base-emitter junction, and eliminates the need of extra capacitance. An additional capacitor is used only when more capacitance is desired, as is in the oscillator of the example. The resonator RE has a configuration of a paralleled LC resonator having a variable capacitance diode (varactor diode) Cvar as the capacitor.

In order to analyze this oscillator, first of all, S-parameters of a 2-port network shown in FIG. 12 should be determined. Next, the open-loop transfer function $b_Y/a_X$ in the the Equation (6) is calculated. These operations are performed by, for example, the network analyzer circuit 101 and the transfer function calculator circuit 102 shown in FIG. 11. Then finally, the transfer function is checked against the oscillation conditions, the above Equations (9) and (10). The VCO 40 is actually constructed according to this analysis, and is laid out on a 6-layer glass-epoxy printed-circuit board with all surface-mount parts. The simulated results are compared with measured performance.

Figure 13:
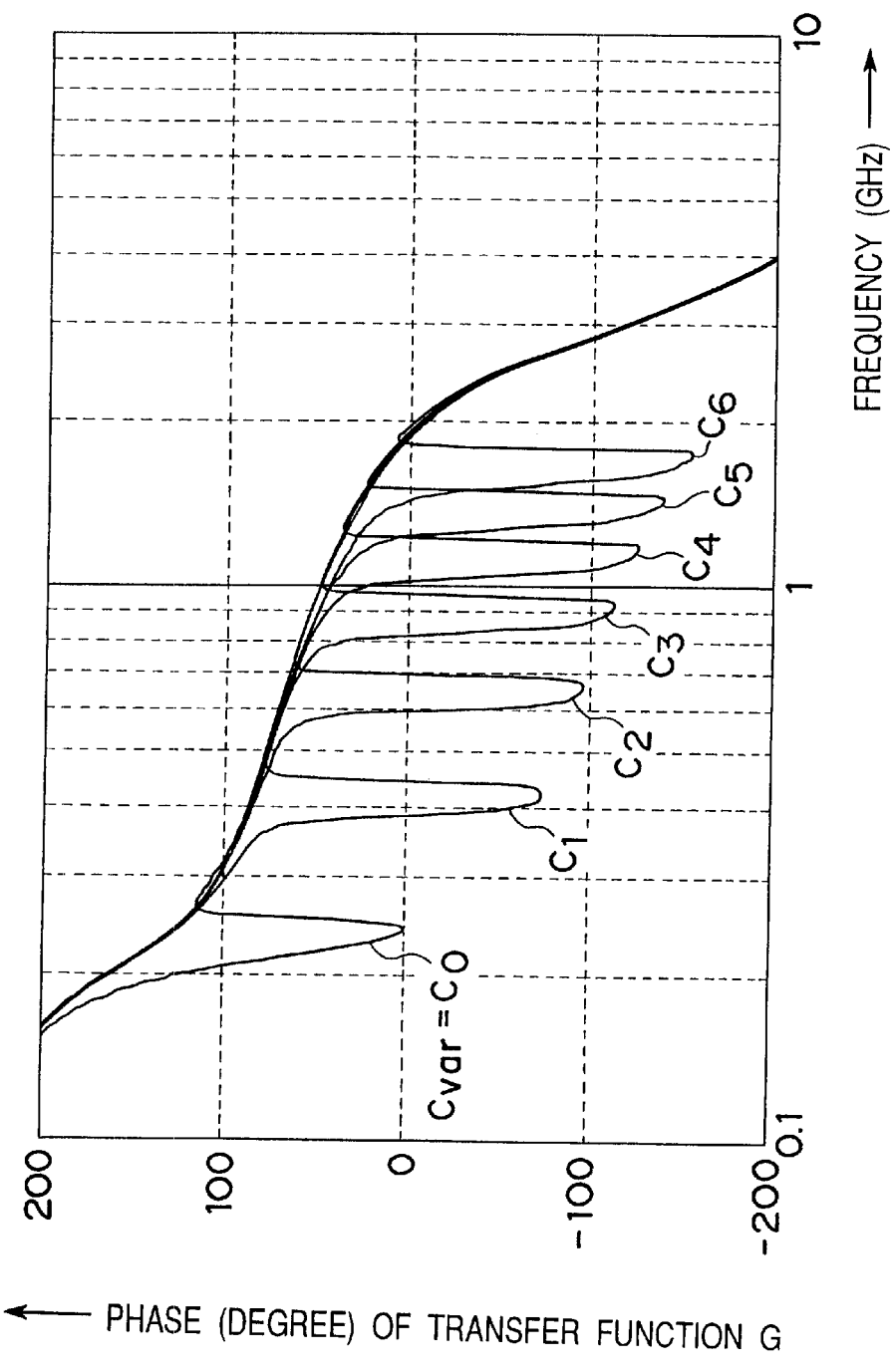
FIG. 13 is a graph showing frequency characteristics of phase of a transfer function G of the VCO 40 shown in FIG. 12, which was measured by the measuring process according to the preferred embodiment of the present invention.
Figure 14:
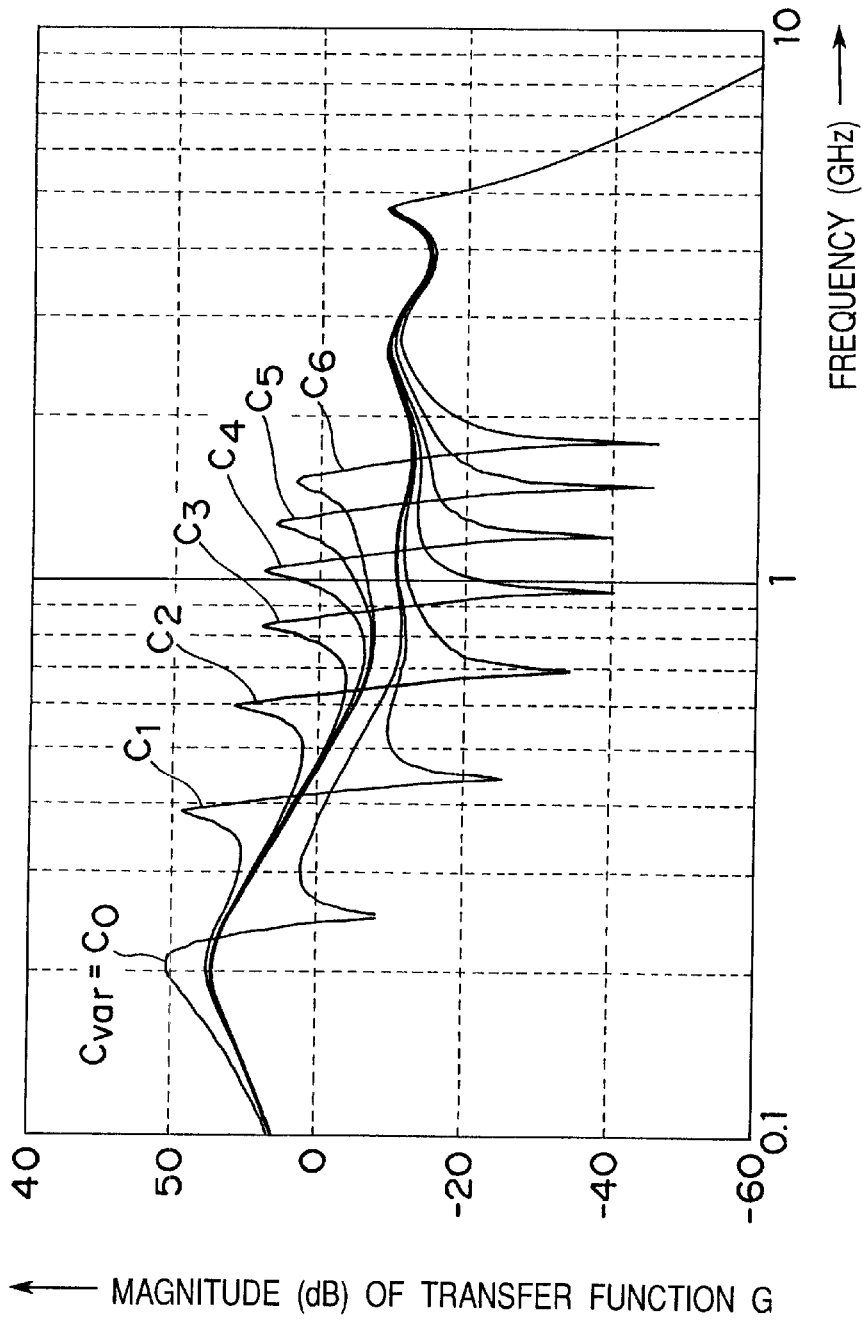
FIG. 14 is a graph showing frequency characteristics of magnitude of the transfer function G of the VCO 40 shown in FIG. 12, which was measured by the measuring process according to the preferred embodiment of the present invention.
Figure 15:
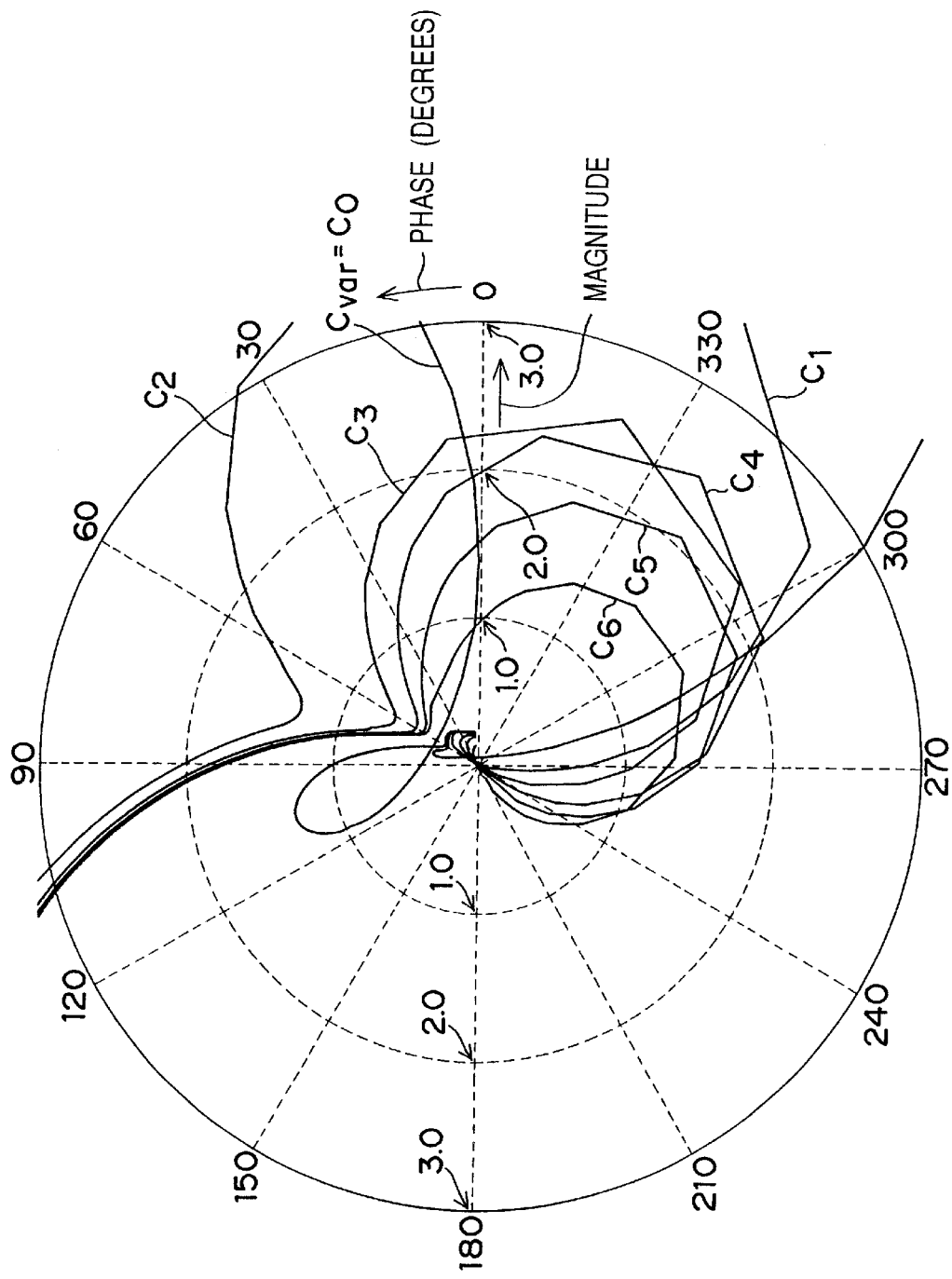
FIG. 15 is a graph showing vector representation of the transfer function G of the VCO 40 shown in FIG. 12, which was measured by the measuring process according to the preferred embodiment of the present invention.

FIG. 13 is a graph showing frequency characteristics of phase of the transfer function G of the VCO 40 shown in FIG. 12, which was measured by the measuring process according to the preferred embodiment. FIG. 14 is a graph showing frequency characteristics of magnitude of the transfer function G of the VCO 40 shown in FIG. 12, which was measured by the measuring process according to the preferred embodiment. FIG. 15 is a graph showing vector representation (or Bode diagram) of the transfer function G of the VCO 40 shown in FIG. 12, which was measured by the measuring process according to the preferred embodiment.

In other words, simulated phase and magnitude of the open-loop transfer function G for the forward transmission term $b_Y/a_X$ are calculated and shown in FIGS. 13 and 14, respectively. Also, the vector representation of the phase and magnitude of the open-loop transfer function G is plotted in polar coordinates of FIG. 15. Each plot has multiple traces using, as parameters, different values of Cvar, which is capacitance of the variable capacitance diode (varactor diode) in the resonator RE.

The oscillation conditions, the above Equations (8) and (9), state that the magnitude of the open-loop transfer function G must be equal to or greater than unity with a 360° (or 0°) phase shift. With this in mind, oscillation points can be easily found in FIG. 15. The requirement for phase shift to be 360° (or 0°) indicates that the oscillation points must lie on the right half of the horizontal coordinate in FIG. 15. The other requirement for magnitude to be greater than 1 further limits the oscillation possibilities: the oscillation points must lie outside a circle of magnitude=1.0. Combining these two requirements together, an area that meets the requirements can be determined, and the area is shown in FIG. 15. It is found out that each trace intersects with this area only once, indicating stable oscillation with no spurious mode. It should be noted that traces for $C_1$ and $C_2$ intersect with the area outside the plot because of selected magnitude.

Intersect frequencies, which oscillation frequencies can be obtained by placing markers on the points of intersections and reading out independent parameter values, or by using FIGS. 13 and 14 showing the phase and the magnitude, respectively.

As described in detail above, the method and apparatus for measuring an electric circuit or the method and apparatus for designing an electric circuit according to the preferred embodiments of the present invention includes:

entering an equivalent circuit of the electric circuit, the equivalent circuit comprising a plurality of elements respectively having element values thereof;

specifying a break point and a virtual ground in the entered equivalent circuit, the break point being for disconnecting an electric path for forming a closed-loop circuit;

generating a 2-port network by disconnecting the electric path at the specified break point in the entered equivalent circuit so as to form first and second terminals that are two ends of the electric path, the 2-port network having a first port comprising the first terminal and the specified virtual ground, and having a second port comprising the second terminal and the specified virtual ground;

calculating S-parameters of the generated 2-port network; and calculating an open-loop transfer function of the electric circuit in accordance with the calculated S-parameters.

The method and apparatus therefore preferably further includes calculating characteristic parameters of the electric circuit in accordance with the calculated open-loop transfer function.

Therefore, it is possible to provide the method and apparatus for measuring an electric circuit, capable of measuring circuit parameters by analyzing an electric circuit such as an RF circuit, a microwave circuit or the like in a complete form using a method simpler than that of the prior art. Moreover, it is possible to provide the method and apparatus for designing an electric circuit, capable of designing circuit parameters by analyzing an electric circuit such as an RF circuit, a microwave circuit or the like in a complete form using a method simpler than that of the prior art. Furthermore, it is possible to provide a recording medium recording a program for measuring an electric circuit or a method of designing an electric circuit, capable of measuring or designing circuit parameters by analyzing an electric circuit such as an RF circuit, a microwave circuit or the like in a complete form using a method simpler than that of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of measuring an electric circuit including the steps of:

entering an equivalent circuit of said electric circuit, said equivalent circuit comprising a plurality of elements respectively having element values thereof;

specifying a break point and a virtual ground in said entered equivalent circuit, said break point being for disconnecting an electric path for forming a closed-loop circuit;

generating a 2-port network by disconnecting said electric path at said specified break point in said entered equivalent circuit so as to form first and second terminals that are two ends of said electric path, said 2-port network having a first port comprising said first terminal and said specified virtual ground, and having a second port comprising said second terminal and said specified virtual ground;

calculating S-parameters of said generated 2-port network; and calculating a complete open-loop transfer function of said electric circuit in accordance with said calculated S-parameters, wherein said complete open-loop transfer function, G, is evaluated based on the equation, $G=(S_{21}-S_{12})/(1-S_{11}S_{22})$, where $S_{11}$, $S_{12}$, $S_{21}$, and $S_{22}$ are said calculated S-parameters.

2. The method as claimed in claim 1, further including the step of calculating characteristic parameters of said electric circuit accordance with said calculated complete open-loop transfer function.

3. The method as claimed in claim 1, further including the steps of:
- entering other element value of at least one of said plurality of elements of said entered equivalent circuit; and
- repeatedly executing the step of specifying, the step of generating and the two steps of calculating for said equivalent circuit of said electric circuit containing said other element value.

4. The method as claimed in claim 2, further including the steps of:
- entering other element value of at least one of said plurality of elements of said entered equivalent circuit; and
- repeatedly executing the step of specifying, the step of generating and the three steps of calculating for said equivalent circuit of said electric circuit containing said other element value.

5. The method as claimed in claim 2,
wherein said electric circuit is an oscillator, and the characteristic parameters are at least one of an oscillation frequency, a gain margin, a phase margin and a loaded-Q.

6. The method as claimed in claim 4,
wherein said electric circuit is an oscillator, and the characteristic parameters are at least one of an oscillation frequency, a gain margin, a phase margin and a loaded-Q.

7. The method as claimed in claim 2,
wherein said electric circuit is an amplifier circuit, and the characteristic parameters are at least one of a maximum gain within a 3-dB bandwidth, the 3-dB bandwidth and a stability factor.

8. The method as claimed in claim 4,
wherein said electric circuit is an amplifier circuit, and the characteristic parameters are at least one of a maximum gain within a 3-dB bandwidth, the 3-dB bandwidth and a stability factor.

9. An apparatus for measuring an electric circuit comprising:
- entering means for entering an equivalent circuit of said electric circuit, said equivalent circuit comprising a plurality of elements respectively having element values thereof;
- specifying means for specifying a break point and a virtual ground in said entered equivalent circuit, said break point being for disconnecting an electric path for forming a closed-loop circuit;
- generating means for generating a 2-port network by disconnecting said electric path at said specified break point in said entered equivalent circuit so as to form first and second terminals that are two ends of said electric path, said 2-port network having a first port comprising said first terminal and said specified virtual ground, and having a second port comprising said second terminal and said specified virtual ground;
- first calculating means for calculating S-parameters of said generated 2-port network; and
- second calculating means for calculating a complete open-loop transfer function of said electric circuit in accordance with said calculated S-parameters, wherein said complete open-loop transfer function, G, is evaluated based on the equation, $G=(S_{21}-S_{12})/(1-S_{11}S_{22})$, where $S_{11}$, $S_{12}$, $S_{21}$, and $S_{22}$ are said calculated S-parameters.

10. The apparatus as claimed in claim 9, further comprising third calculating means for calculating characteristic parameters of said electric circuit in accordance with said calculated complete open-loop transfer function.

11. The apparatus as claimed in claim 9, further comprising outputting means for displaying or printing data with respect to said calculated complete open loop transfer function.

12. The apparatus as claimed in claim 9, further comprising outputting means for displaying or printing data with respect to said calculated characteristic parameters.

13. A method of designing an electric circuit including the steps of:
- entering an equivalent circuit of said electric circuit, said equivalent circuit comprising a plurality of elements respectively having element values thereof;
- specifying a break point and a virtual ground in said equivalent circuit, said break point being for disconnecting an path for forming a closed-loop circuit;
- generating a 2-port network by disconnecting said electric path at said specified break point in said entered equivalent circuit so as to form first and second terminals that are two ends of said electric path, said 2-port network having a first port comprising said first terminal and said specified virtual ground, and having a second port comprising said second terminal and said specified virtual ground;
- calculating S-parameters of said generated 2-port entered electric network;
- calculating a complete open-loop transfer function of said electric circuit in accordance with said calculated S-parameters;
- calculating characteristic parameters of said electric circuit in accordance with said calculated complete open-loop transfer function; and
- specifying an element whose element value to be changed among said plurality of elements of said equivalent circuit of said electric circuit, and calculating element values of said equivalent circuit when the characteristic parameters of said electric circuit become desired characteristic parameters, wherein said complete open-loop transfer function G, is evaluated based on the equation, $G=(S_{21}-S_{12})/(1-S_{11}S_{22})$, where $S_{11}$, $S_{12}$, $S_{21}$, and $S_{22}$ are said calculated S-parameters.

14. The method as claimed in claim 13,
wherein said electric circuit is an oscillator, and the characteristic parameters are at least one of an oscillation frequency, and a loaded-Q.

15. The method as claimed in claim 13,
wherein said electric circuit is an amplifier circuit, and the characteristic parameters are at least one of a maximum gain within a 3-dB bandwidth and the 3-dB bandwidth.

16. An apparatus for designing an electric circuit comprising:
- entering means for entering an equivalent circuit of said electric circuit, said equivalent circuit comprising a plurality of elements respectively having element values thereof;
- specifying means for specifying a break point and a virtual ground in said entered equivalent circuit, said break point being for disconnecting an electric path for forming a closed-loop circuit;

generating means for generating a 2-port network by disconnecting said electric path at said specified break point in said entered equivalent circuit so as to form first and second terminals that are two ends of said electric path, said 2-port network having a first port comprising said first terminal and said specified virtual ground, and having a second port comprising said second terminal 1 and said specified virtual ground;

first calculating means for calculating S-parameters of said generated 2-port network;

second calculating means for calculating a complete open-loop transfer function of said electric circuit in accordance with said calculated S-parameters, third calculating means for calculating characteristic parameters of said electric circuit in accordance with said calculated complete open-loop transfer function; and fourth calculating means for specifying an element whose element value to be changed among said plurality of elements of said equivalent circuit of said electric circuit, and calculating element values of said equivalent circuit when the characteristic parameters of said electric circuit become desired characteristic parameters, wherein said complete open-loop transfer function G is evaluated based on the equation, $G=(S_{21}-S_{12})/(1-S_{11}S_{22})$, where $S_{11}$, $S_{12}$, $S_{21}$, and $S_{22}$ are said calculated S-parameters.

17. The apparatus as claimed in claim 16, further comprising outputting means for displaying or printing at least one of said calculated complete open-loop transfer function of said electric circuit, said calculated characteristic parameters of said electric circuit, and said calculated element value of said equivalent circuit when the characteristic parameters of said electric circuit become the desired characteristic parameters.

18. A computer-readable recording medium for recording a program for measuring an electric circuit, said program including program instructions for:

entering an equivalent circuit of said electric circuit, said equivalent circuit comprising a plurality of elements respectively having element values thereof; specifying a break point and a virtual ground in said entered equivalent circuit, said break point being for disconnecting an electric path for forming a closed-loop circuit;

generating a 2-port network by disconnecting said electric path at said specified break point in said entered equivalent circuit so as to form first and second terminals that are two ends of said electric path, said 2-port network having a first port comprising said first terminal and said specified virtual ground, and having a second port comprising said second terminal and said specified virtual ground;

calculating S-parameters of said generated 2-port network; and calculating a complete open-loop transfer function circuit in accordance with said calculated S-parameters, wherein said complete open-loop transfer function, G, is evaluated based on the equation, $G=(S_{21}-S_{12})/(1-S_{11}S_{22})$, where $S_{11}$, $S_{12}$, $S_{21}$, and $S_{22}$ are said calculated S-parameters.

19. A computer-readable recording medium for recording a program for designing an electric circuit, said program including program instructions for:

entering an equivalent circuit of said electric circuit, said 25 equivalent circuit comprising a plurality of elements respectively having element values thereof;

specifying a break point and a virtual ground in said entered equivalent circuit, said break point being for disconnecting an electric path for forming a closed-loop circuit;

generating a 2-port network by disconnecting said electric path at said specified break point in said entered equivalent circuit so as to form first and second terminals that are two ends of said electric path, said 2-port network having a first port comprising said first terminal and said specified virtual ground, and having a second port comprising said second terminal and said specified virtual ground;

calculating S-parameters of said generated 2-port network;

calculating a complete open-loop transfer function of said electric circuit in accordance with said calculated S-parameters;

calculating characteristic parameters of said electric circuit in accordance with said calculated open-loop transfer function; and specifying an element whose element value to be changed among said plurality of elements of said equivalent circuit of said electric circuit, and calculating element values of said equivalent circuit when the characteristic parameters of said electric circuit become desired characteristic parameters, wherein said complete open-loop transfer function, G, is evaluated based on the equation, $G=(S_{21}-S_{12})/(1-S_{11}S_{22})$, where $S_{11}$, $S_{12}$, $S_{21}$, and $S_{22}$ are said calculated S-parameters.

* * * * *

UNITED STATES PATENT AND TRADEMARK OFFICE
CERTIFICATE OF CORRECTION

PATENT NO. : 6,571,372 B2
DATED : May 27, 2003
INVENTOR(S) : Harada

It is certified that error appears in the above-identified patent and that said Letters Patent is hereby corrected as shown below:

<u>Title page,</u>
Item [56], References Cited, U.S. PATENT DOCUMENTS,
"5,949,900" should read -- 5,949,990 --

Signed and Sealed this

Eighteenth Day of May, 2004

JON W. DUDAS
*Acting Director of the United States Patent and Trademark Office*